United States Patent [19]

Yamada et al.

[11] Patent Number: 5,314,931
[45] Date of Patent: May 24, 1994

[54] RESIST COMPOSITIONS

[75] Inventors: Motoyuki Yamada; Tomoyoshi Furihata, both of Kawasaki; Osamu Watanabe, Jouetsu; Fujio Yagihashi, Yokohama, all of Japan

[73] Assignee: Shin-Etsu Chemical Co., Limited, Tokyo, Japan

[21] Appl. No.: 889,370

[22] Filed: May 28, 1992

[30] Foreign Application Priority Data

May 28, 1991 [JP] Japan .................................. 3-152468

[51] Int. Cl.⁵ .......................... C08J 3/28; C08L 33/06; C08F 8/00; C08F 120/10
[52] U.S. Cl. .................................... 522/127; 525/194; 525/227; 526/326
[58] Field of Search ................ 526/326; 525/194, 227; 522/127

[56] References Cited

U.S. PATENT DOCUMENTS 4,705,836 11/1987 Ohtsuka et al. .................. 526/318.1

FOREIGN PATENT DOCUMENTS 0102450 3/1984 European Pat. Off. .
59-45439 3/1984 Japan .
62-115440 5/1987 Japan .
1-300250 12/1989 Japan .

OTHER PUBLICATIONS

Patent Abstracts of Japan, vol. 14, No. 100, JP-A-1 308 412 (1989).

Primary Examiner—Joseph L. Schofer
Assistant Examiner—Wu C. Cheng
Attorney, Agent, or Firm—Birch, Stewart, Kolasch & Birch

[57] ABSTRACT

A resist based on a living polymer is provided. Living anionic polymerization of p-alkoxycarbonylstyrene monomers results in polymers having a molecular weight distribution (Mw/Mn) of from 1 to 1.4.

9 Claims, 1 Drawing Sheet

RESIST COMPOSITIONS

This invention relates to a resist composition for use in forming a fine pattern on the surface of semiconductor elements using ultraviolet or far ultraviolet light.

BACKGROUND OF THE INVENTION

With the advance of LSI technology, the memory capacity of IC chips reaches an order of mega bits and a rule of submicron is thus required for the fineness of wiring pattern. Accordingly, lithography light sources are shifting towards shorter wavelengths from the ultraviolet band to the far ultraviolet band which is more advantageous for fine patterning. Also, the current technique used for etching in the LSI manufacturing process is dry etching using RF plasma.

In these circumstances, the lithography technology uses resists that must be sensitive and transmissive to the wavelength used and resistant against dry etching. More particularly, novolak type resins and other aromatic resins are useful resists in photolithography, especially in G and I rays lithography, in view of their light transmittance at the wavelength used and plasma etching resistance.

However, the light source intensity of far ultraviolet light, including the mercury line spectrum which has a shorter wavelength than G and I line and excimer laser light such as KrF and ArF, is much weaker than the light source intensity of G and I line. Utilization of such ultraviolet light in photolithography has the problem wherein prior art resists conventionally used with G and I line provide unacceptable exposure sensitivity and low light transmittance to far ultraviolet light. As a consequence, there is a need for a new type of resist.

Resists of the chemically amplified type were developed as a substitute for the conventional resists. For example, Japanese Patent Application Kokai (JP-A) No. 45439/1984 discloses a resist composition comprising p-tert-butoxycarbonyloxy-α-methylstyrene, which is an acid unstable polymer having recurring branched groups and a diaryl iodonium salt, which is a photopolymerization initiator capable of generating acid upon exposure to radiation. Upon exposure of the resist to far ultraviolet light, the diaryl iodonium salt decomposes to generate an acid which in turn, causes cleavage of the p-tert-butoxycarbonyl group p-tert-butoxy-carbonyloxy-α-methylstyrene into a polar group. Then a desired pattern is obtained by dissolving away the thus exposed areas or unexposed areas with base or non-polar solvent.

JP-A 115440/1987 discloses a resist composition comprising poly-4-tert-butoxy-α-styrene and di(tert-butylphenyl) iodonium trifluoromethane sulforonate, which are dissolved in diglyme and then exposed to far ultraviolet light. This resist achieves a high degree of resolution through the same reaction mechanism as the resist of JP-A 45439/1984.

The polymers used in these well-known resists are obtained by conventional radical or cationic polymerization of corresponding monomers. Since no special attention is paid to the molecular weight distribution of polymers in the conventional polymerization techniques, polymers having a broad and uneven molecular weight distribution are obtained. According to the inventors' investigations, if a resist based on a polymer having a broad molecular weight distribution is used, a low molecular weight moiety of the polymer can be gasified during the vacuum step of the wafer manufacturing process, resulting in a lowering of vacuum and contamination of the processing atmosphere. There always arises the problem that the polymer locally experiences a fast or slow dissolution rate due to uneven molecular weight distribution. As a result, an unstable state of patterning will often occur.

In order to utilize the polymers obtained by conventional polymerization methods as resists, it is necessary to adjust the molecular weight distribution of the polymer after polymerization. Such post adjustment is cumbersome and effective control of the molecular weight is impossible to achieve. The conventional resist compositions are not regarded as suitable for the manufacture of high performance semiconductor elements such as super LSI. As a consequence, there is a desire to overcome these problems.

SUMMARY OF THE INVENTION

Therefore, an object of the present invention is to provide a novel and improved resist composition that eliminates the above-mentioned problems of the prior art and is useful for super LSI applications.

The inventors have found that living anionic polymerization of a monomer having rational formula (1):

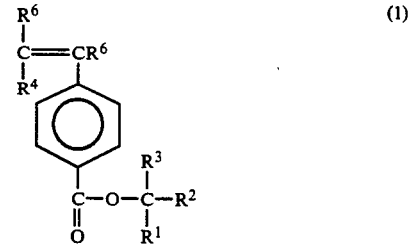

(1)

wherein $R^1$ to $R^5$ are independently hydrogen or an alkyl group having 1 to 12 carbon atoms, and $R^6$ is hydrogen or a methyl group, results in a living polymer having a narrow molecular weight distribution of from 1 to 1.4. The molecular weight distribution used herein is defined as the weight average molecular weight divided by the number average molecular weight, i.e., Mw/Mn. It is possible to control the molecular weight of the living polymer to a desired value. A resist based on such a polymer having a narrow molecular weight distribution can provide sufficient exposure sensitivity relative to ultraviolet and far ultraviolet light without a loss of light intensity, and solves the problems of the prior art, including lowering of vacuum during the vacuum step in the wafer manufacturing process, contamination of the processing atmosphere, a varying polymer dissolving rate, and unstable patterning. The resist of the invention is thus adapted for the manufacture of super LSI.

DETAILED DESCRIPTION OF THE INVENTION

Figure 1:
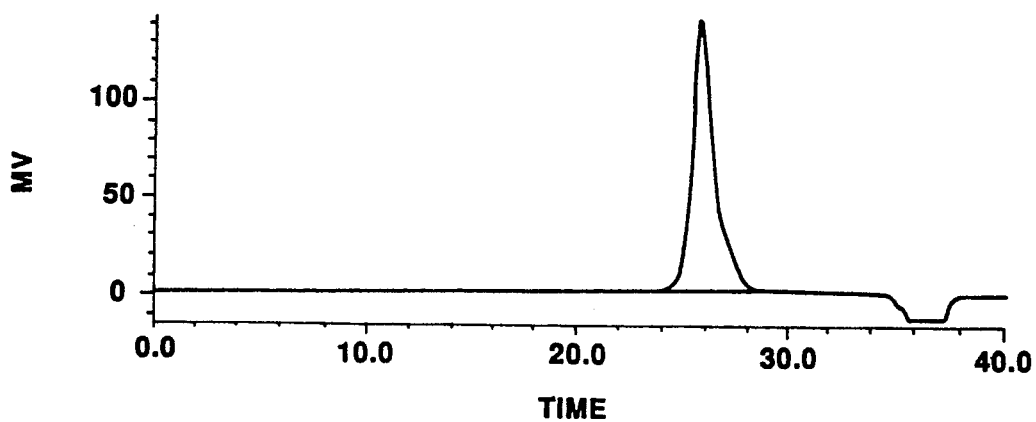
FIG. 1 is a GPC elution curve of the polymer prepared in Preparation 1.

The polymer which constitutes a predominant component of the resist according to the present invention is obtained by living anionic polymerization of a monomer having rational formula (1).

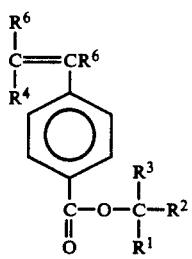

(1)

In formula (1), $R^1$ to $R^5$ are independently selected from the group consisting of a hydrogen atom and an alkyl group having 1 to 12 carbon atoms. Exemplary alkyl groups include methyl, ethyl, propyl, butyl and pentyl groups, with alkyl groups having 1 to 3 carbon atoms being preferred. $R^6$ is a hydrogen atom or a methyl group.

Examples of the monomer of formula (1) include p-tert-butoxycarbonylstyrene, p-tert-butoxycarbonyl-α-methylstyrene, and p-triethylmethoxycarbonylstyrene, with the p-tert-butoxycarbonylstyrene being preferred because of ease of living polymerization.

The monomers may be used alone or in admixture of two or more. That is, the polymers may be homopolymers or copolymers.

Living polymerization of the monomer of formula (1) is often carried out by adding a polymerization initiator to the monomer in an organic solvent. Organometallic compounds are preferred initiators. Exemplary are organic alkali metals including n-butyllithium sec-butyllithium tert-butyllithium sodium naphthalene, potassium naphthalene, sodium anthracene, disodium α-methylstyrene tetramer, cumylpotassium, and cumylcecium. The amount of polymerization initiator added may be determined through calculation from the desired molecular weight of a polymer to be produced and the moles of the starting monomer.

Examples of the organic solvent used include aromatic hydrocarbons such as cyclic ethers, and aliphatic hydrocarbons such as benzene, toluene, tetrahydrofuran, dioxane, tetrahydropyran, dimethoxyethane, n-hexane, and cyclohexane, alone or in admixture of two or more.

In living polymerization of monomers of rational formula (1), optimum reaction conditions, including which living polymerization initiator is to be utilized and the concentration of monomer in organic solvent, vary with the choice of the particular functional group in the monomer. A preliminary experiment is preferably carried out to predetermine optimum conditions. In general, monomers to be polymerized are present in organic solvents in concentrations of about 1 to 50% by weight, preferably about 5 to 20% by weight.

The monomers can be polymerized by stirring their organic solvent solution after the reaction system is evacuated to vacuum, with or without subsequent purging of the atmosphere with an inert gas such as argon and nitrogen. The reaction temperature may range from $-100°$ C. to room temperature. For example, a reaction temperature of $-100°$ C. is selected for tetrahydrofuran system and room temperature is selected for benzene system.

Living polymerization continuously proceeds since a carbanion does not attack ether oxygen at the para-position of a phenyl group, and the vinyl group in the styrene moiety is selectively polymerized. Polymerization reaction is generally complete within about 10 minutes to about 5 hours. There are obtained polymers represented by formula (2).

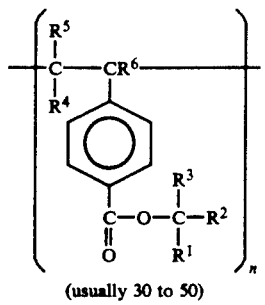

(usually 30 to 50)

Thereafter, a stopper such as methanol, water, and methylbromide is added to the reaction solution to terminate the reaction. If necessary, the polymer is purified and isolated from the reaction solution by adding poor solvent such as methanol to the solution, which causes the reaction product to precipitate, followed by washing and drying. Often, such purification is desirable because the polymer at the end of reaction generally contains unreacted reactants and by-products as impurities. If such a crude polymer is used as a resist in the manufacture of super LSI, the impurities can be detrimental to the wafer manufacturing process.

With respect to molecular weight distribution, the thus obtained polymers are mono-dispersed. Particularly, polymers having a narrow molecular weight distribution Mw/Mn of from 1 to 1.4, especially from 1 to 1.2 are obtained. A Mw/Mn of more than 1.4 will offset the living polymerization effect so that an unstable state can occur during patterning due to low molecular weight polymer components.

There are obtained polymers in a yield of approximately 100% based on the monomers used. The molecular weight of a polymer can be readily calculated from the weight of the monomer used and the moles (or molecular number) of the polymerization initiator. The number average molecular weight (Mn) is determined through measurement by a membrane osmometer, the composition determined through infrared (IR) spectroscopy and $^1$H-NMR, and the molecular weight distribution determined by gel permeation chromatography (GPC), wherein the polymer can be characterized to evaluate whether it is a desired one or not.

The resist composition of the invention contains the polymer as a predominant component, and it may further contain additional components, for example, photo-initiators and inert organic solvents. The photo-initiator is used to generate strong acid upon exposure to light. In a wafer stepper, the photo-initiator in the exposed resist film is decomposed to generate strong acid which in turn, causes cleavage of a group of formula (3) in the living polymer into a group of formula (4).

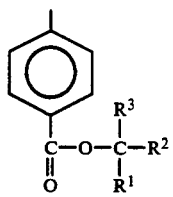

(3)

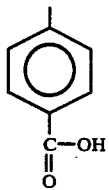

(4)

As a result, the polymer is converted into an alkali soluble polymer.

Typical of the photo-initiator are onium salt cationic photo-initiators, example of which are given below.

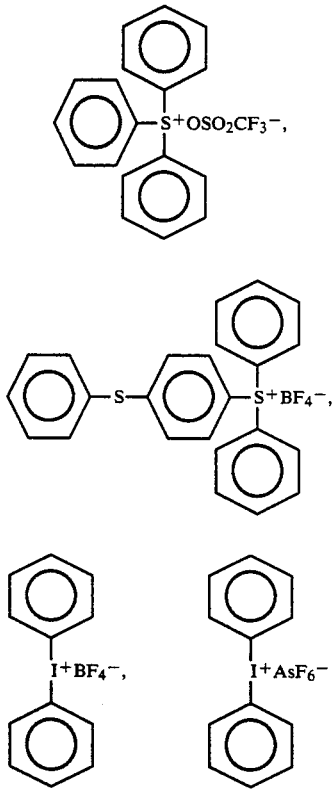

Other useful onium salt cationic photo-initiators are disclosed in JP-A 45439/1984, 115440/1987, and 300250/1989, and U.S. Pat. No. 4,537,854. The initiators are not limited to these examples and any substances capable of generating acid upon exposure to light may be used.

Preferably the photo-initiators are blended in amounts of about 0.01 to about 20% by weight, more preferably about 0.5 to about 5% by weight of the resist composition.

In practice, the resist is used in solution form by dissolving the resist in a large volume of organic solvent. The organic solvent used is one in which the resist based on the living polymer according to the invention is soluble and one which allows a resist film to uniformly spread. Exemplary are butyl acetate, xylene, acetone, and cellosolve acetate, with the cellosolve acetate being most preferred. The organic solvents may be used alone or in admixture of two or more.

The use and light exposure of the resist may be in accordance with the well-known conventional lithography. In particular, the resist of the invention is adapted for fine patterning with ultraviolet and far ultraviolet light having a wavelength of 254 to 193 nm.

There is described a resist composition which contains as a predominant component a polymer having a controlled molecular weight and a narrow molecular weight distribution, which provides sufficient exposure sensitivity relative to ultraviolet and far ultraviolet light without a lowering of light intensity, and which eliminates problems, such as lowering of vacuum during the vacuum step in after manufacturing process, contamination of the processing atmosphere, variation of the polymer dissolving rate, and unstable patterning. The invention thus provides a resist suited for the manufacture of super LSI.

EXAMPLE

Examples of the present invention are given below by way of illustration and not by way of limitation. Before entering the examples, it is first described how to prepare a polymer.

Preparation 1

The reactant used is p-tert-butoxy-carbonylstyrene monomer which is pretreated with $CaH_2$ to remove water and impurities, refined with sodium benzophenone, and distilled. A 1-liter flash is charged with 600 ml of tetrahydrofuran solvent and $4 \times 10^{-3}$ mol of potassium naphthalene as a polymerization initiator. To the mixture is added 48 grams of the refined p-tert-butoxycarbonylstyrene monomer diluted with 100 ml of tetrahydrofuran at $-78°$ C. Polymerization is allowed to take place for one hour whereupon the solution turns deep red. Polymerization is terminated by adding methanol to the reaction solution. The reaction solution is poured into methanol whereby the polymer is precipitated and thereafter, separated therefrom and purified. Drying yields 47 grams of a white polymer.

FIG. 1 is the GPC elution curve of the polymer. The molecular weight distribution (Mw/Mn) is 1.20. By membrane osmometry, the number average molecular weight (Mn) of the polymer is measured to be $1.1 \times 10^4$ g/mol.

Preparation 2

The reactant used is p-tert-butoxy-carbonyl-α-methylstyrene monomer which is dried and purified in the same manner as in Preparation 1. A 2-liter flask is charged with 1500 ml of tetrahydrofuran solvent and $4.5 \times 10^{-3}$ mol of sec-butyllithium as a polymerization initiator. To the mixture is added 67 grams of the refined p-tert-butoxy-carbonyl-α-methylstyrene monomer diluted with 200 ml of tetrahydrofuran at $-78°$ C. Polymerization is allowed to take place for 4 hours whereupon the solution turns red. Polymerization is terminated by adding methanol to the reaction solution. The reaction solution is poured into methanol whereby the polymer is precipitated and thereafter, separated therefrom and purified. Drying yields 66.8 grams of a white polymer. The molecular weight distribution (Mw/Mn) is 1.18. By membrane osmometry, the number average molecular weight (Mn) of the polymer is measured to be $1.5 \times 10^4$ g/mol.

EXAMPLES 1 AND 2

Polymer solutions are obtained by dissolving 2 grams of the polymers obtained in Preparations 1 and 2, respectively, in 12 ml of cellosolve acetate along with 0.15 grams of an onium salt represented by the following formula.

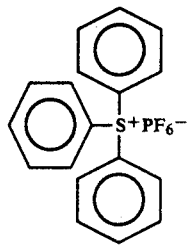

The polymer solutions are coated to one surface of silicon wafers by means of a spin coater and dried into polymer films of 1 μm thick. Using a stepper having built therein a light source for emitting light at a wavelength of 254 nm, the wafers are exposed to light, developed, and post-treated in a conventional manner. Both the polymer films have a line-and-space resolution of 0.4 μm.

COMPARATIVE EXAMPLE

Figure 2:
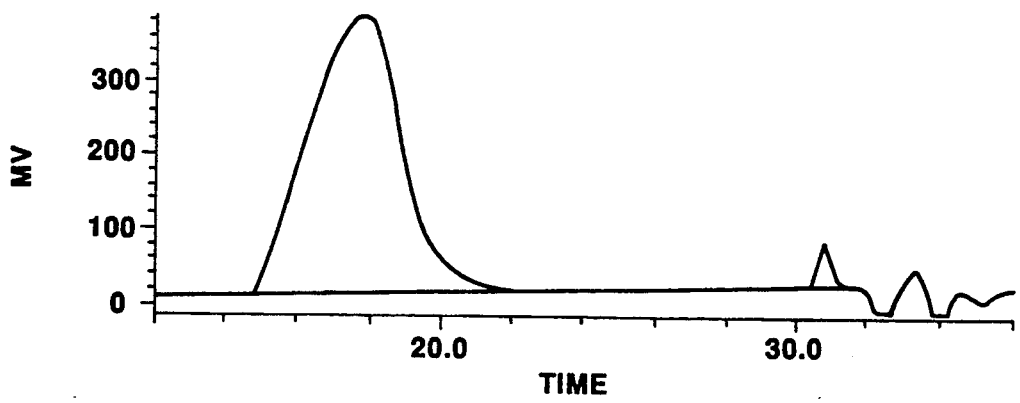
FIG. 2 is a GPC elution curve of the polymer prepared in Comparative Example.

In a nitrogen purged vessel, a solution of 0.13 grams of 2,2-azobisisobutyronitrile and 5 grams of p-tert-butoxycarbonylstyrene monomer in 20 ml of toluene is subjected to polymerization reaction for 5 hours at 70° C. The resulting polymer is purified as in Preparation 1. The GPC elution curve of the polymer shown in FIG. 2 indicates a molecular weight distribution (Mw/Mn) of 3.23.

A polymer solution is obtained by dissolving 2.0 grams of the polymer in 12 ml of cellosolve acetate along with 0.15 grams of the same onium salt as in Example 1. As in Example 1, the polymer solution is coated and then exposed to light by means of the stepper. The patterns obtained on this polymer film are satisfactory at a width of up to 0.6 μm, but fine patterns of less than 0.6 μm show overhangs. Some unresolved areas are observed.

Although some preferred embodiments have been described, many modifications and variations may be made thereto in view of the above teachings. It is therefore to be understood that within the scope of the appended claims, the invention may be practiced otherwise than as specifically described.

We claim:

1. A positive resist composition comprising a polymer, a photo-initiator and an inert organic solvent, said polymer being obtained by living anionic polymerization of at least one monomer having the formula (1):

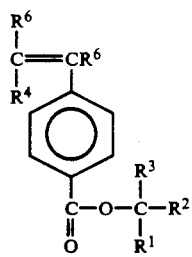

where $R^1$ to $R^5$ are independently selected from the group consisting of hydrogen and alkyl groups having 1 to 12 carbon atoms, and $R^6$ is hydrogen or a methyl group; said polymer having a molecular weight distribution of from 1.0 to 1.2; said photo-initiator being one which is decomposed upon exposure to light to generate a strong acid and to cause cleavage of a group having formula (3) in the living polymer into a group having formula (4),

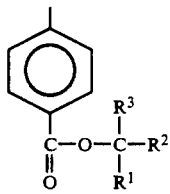

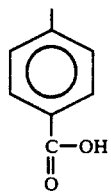

wherein $R^1$ and $R^3$ are the same as defined above, thereby converting said polymer into an alkali soluble polymer.

2. The positive resist composition according to claim 1, wherein the monomer having formula (1) is selected from a group consisting of p-tert-butoxycarbonylstyrene, p-tert-butoxycarbonyl-α-methylstyrene, and p-triethylmethoxycarbonylstyrene.

3. The positive resist composition according to claim 2, wherein the monomer having formula (1) is p-tert-butoxy-carbonylstyrene.

4. The positive resist composition according to claim 1, wherein the photo-initiator is an onium salt cationic photo-initiator.

5. The positive resist composition according to claim 1, wherein the photo-initiator is present in an amount of about 0.01% to about 20.0% by weight of the total weight of the resist composition.

6. The positive resist composition according to claim 5, wherein the photo-initiator is present in an amount of about 0.5% to about 5.0% by weight of the total weight of the resist composition.

7. The positive resist composition according to claim 2, wherein the monomer having formula (1) is p-tert-butoxy-carbonyl-α-methylstyrene.

8. A polymer film formed from the positive resist composition according to claim 1.

9. The polymer film according to claim 8, wherein the polymer film has a line-and-space resolution of 0.4 μm when the polymer film is 1 μm thick, is exposed at a wavelength of 254 nm to 193 nm, and is developed.

* * * * *